(12) United States Patent
Kajita

(10) Patent No.: US 7,116,114 B2
(45) Date of Patent: Oct. 3, 2006

(54) POWER SUPPLY NOISE MEASURING DEVICE

(75) Inventor: Mikihiro Kajita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/067,574

(22) Filed: Feb. 25, 2005

(65) Prior Publication Data

US 2005/0212528 A1    Sep. 29, 2005

(30) Foreign Application Priority Data

Mar. 1, 2004    (JP) .............................. 2004-056253

(51) Int. Cl.
*G01R 29/26* (2006.01)
*G01R 23/20* (2006.01)

(52) U.S. Cl. ...................... 324/613; 324/620

(58) Field of Classification Search ................ 324/613, 324/620, 771, 76.16; 702/69
See application file for complete search history.

(56) References Cited

U.S. PATENT DOCUMENTS

| 4,658,210 | A | * | 4/1987 | de Leon et al. | ......... | 324/76.12 |
| 5,608,331 | A | * | 3/1997 | Newberg et al. | ............ | 324/613 |
| 6,823,293 | B1 | * | 11/2004 | Chen et al. | ................. | 702/191 |

| 2005/0122138 | A1 | * | 6/2005 | Chansungsan et al. | ........ | 327/78 |

FOREIGN PATENT DOCUMENTS

| JP | 59-146643 | 8/1984 |
| JP | 04-268467 | 9/1992 |
| JP | 08-062274 | 3/1996 |
| JP | 2001-144735 | 5/2001 |
| JP | 2002-252331 | 9/2002 |
| JP | U3096469 | 7/2003 |

OTHER PUBLICATIONS

2003 Symposium on VLSI Circuits Digest of Technical Papers, 4-89114-035-6/03, Figure 5.
ISSCC 2002, Feb. 5, 2002, Salon 10-15, Figure 11.2.1.

* cited by examiner

*Primary Examiner*—Anjan Deb
(74) *Attorney, Agent, or Firm*—Michael Best & Friedrich LLP

(57) ABSTRACT

According to one embodiment, a signal from a power supply line is caused to pass through a high pass filter, and a first signal is generated by adding a voltage-divided signal to the signal. In addition, a second signal obtained by adding the voltage-divided signal to an identification voltage is generated. A comparator outputs a comparison result of comparing a voltage of the first signal with a voltage of the second signal, and a counter counts up a count value when the voltage of the first signal is higher than that of the second signal. A sample hold circuit sample-holds the count value just before the counter is reset.

32 Claims, 13 Drawing Sheets

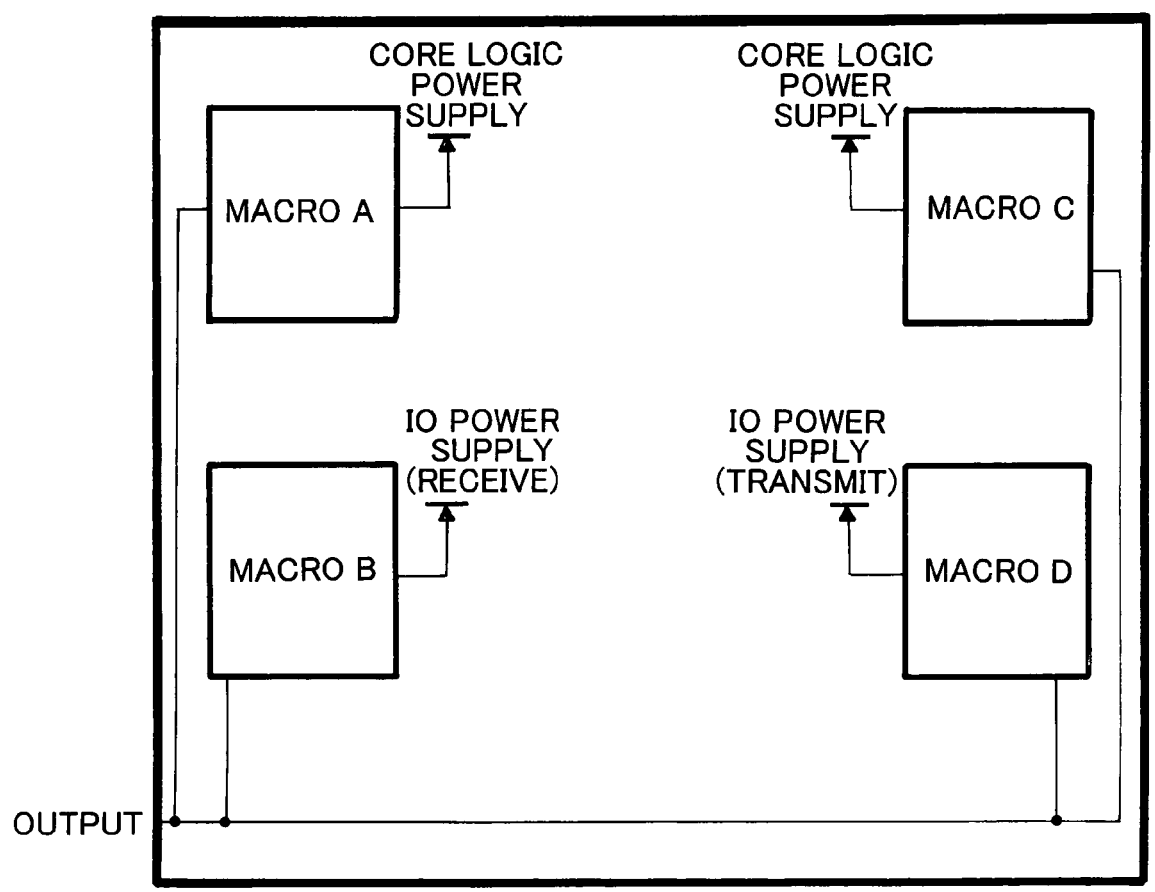

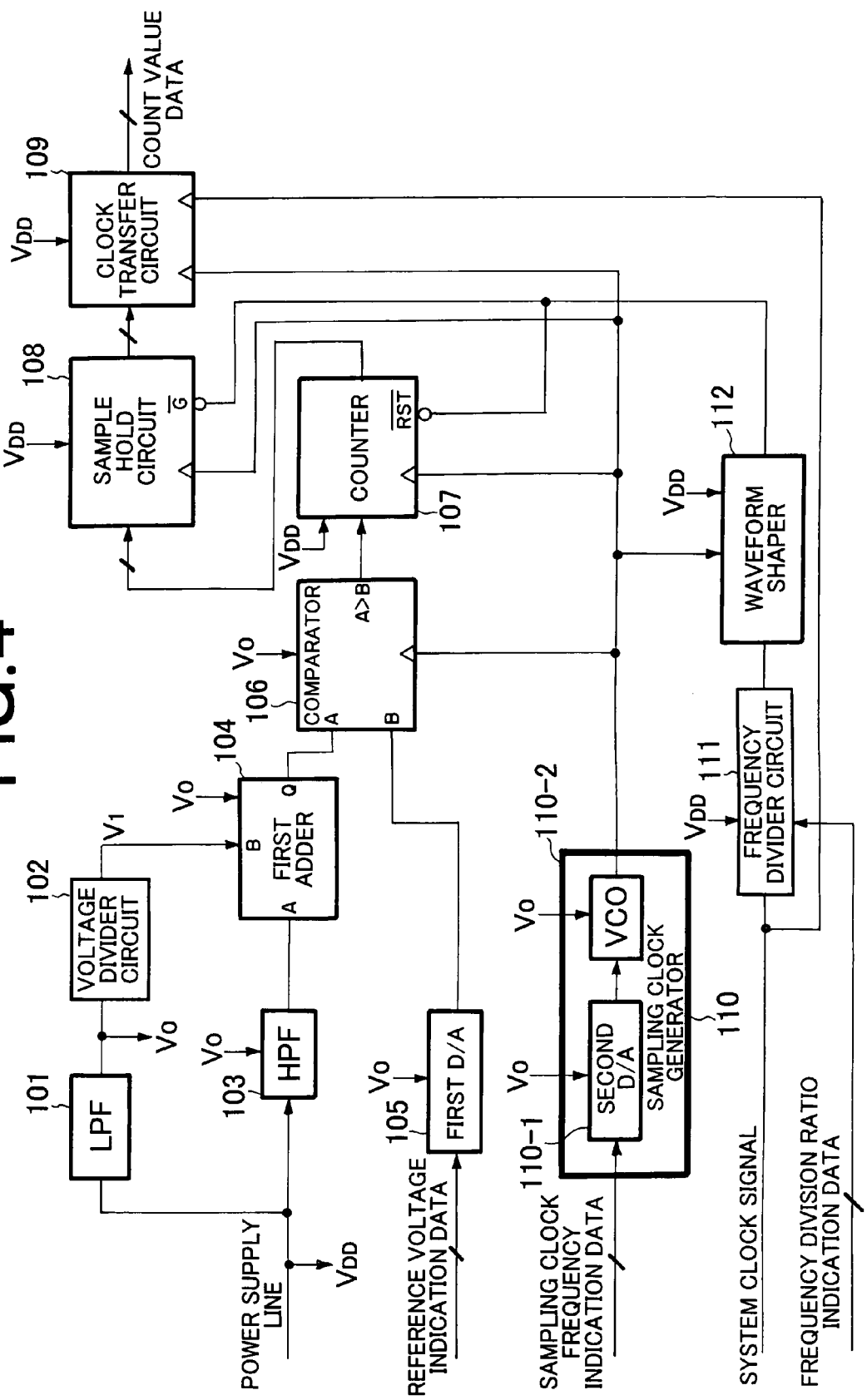

POWER SUPPLY NOISE MEASURING DEVICE

This application claims priority of Japanese Patent Application No. 2004-056253, filed Mar. 1, 2004.

BACKGROUND OF THE INVENTION

1. Field of the Invention

The present invention relates to a noise measuring device that measures a noise signal superimposed on a signal. More specifically, the present invention relates to a power supply noise measuring device that is mounted in a large scale integrated circuit (LSI), and that measures a noise signal superimposed on a power supply signal in the LSI.

2. Description of the Related Art

A complementary metal oxide semiconductor (CMOS) circuit employed in a recent LSI has an advantage of reducing power consumption but has a disadvantage of always generating a power supply noise during switching. The power supply noise greatly influences a delay design in the LSI. When a power supply noise is increased in amount, a delay variation is increased accordingly, with the result that it is necessary to widen a margin for designing timing. The margin widened by as much as the delay variation relative to a timing window that is reduced following acceleration of signal transmission within the LSI greatly influences realization of the signal transmission. It is, therefore, important how accurately the power supply noise amount can be grasped.

In the conventional signal transmission at a rate equal to or lower than a rate in MHz, even if the power supply noise amount is observed on a printed circuit board outside of the LSI, a quantitative evaluation of the noise amount can be performed almost accurately without an influence of a waveform rounding.

However, if the LSI operates at a high-speed equal to or higher a rate in GHz, a rate of the generated power supply noise is accelerated accordingly. If so, it is difficult to measure such a power supply noise on the printed circuit board or the like outside of the LSI. In recent examples, as shown in FIG. 1 (2003 Symposium on VLSI Circuits Digest of Technical Papers, 4-89114-035-6/03, FIG. 5), in Symposium on VLSI Circuits, Intel Corporation proposed a method for extracting a minor variation in a measurement target power supply relative to a reference power supply, and for measuring a power supply noise amount based on a result of a magnitude comparison between the measurement target power supply and the reference power supply. With this method, when the high-speed noise is to be measured, a sampling frequency itself of an output is increased. As a result, it is disadvantageously difficult to transmit the output itself. In addition, a strict restriction is imposed on measurement at a plurality of locations in the LSI. Thus, this method is not suited for acceleration. Besides, probing of a peak noise that suddenly occurs is also difficult, because it depends on the sampling timing.

As another example, as shown in FIG. 2 (ISSCC 2002/Feb. 5, 2002/Salon 10-15/9:00 AM, FIG. 11.2.1), there is proposed a method using a sampling oscilloscope circuit as reported by Takamiya et al. in ISSC2002. With this method, data on a cyclically changing signal is acquired while shifting a data sampling timing by one clock each based on the principle of the sampling oscilloscope. Therefore, a data cycle is extended by T/ΔT times (where T is the clock cycle and ΔT is a resolution for acquiring the data), and the data can be fetched to the outside as a low-speed output. It is noted, however, the noise is assumed as a periodic noise in this method, so that this method is ineffective for a periodic noise. A chance of acquiring the peak noise that suddenly occurs, in particular, is extremely slight, so that it is quite difficult to acquire the peak noise.

The invention disclosed in Japanese Utility Model Registration No. 3096469 relates to a noise measuring device including a first comparator that compares a power supply voltage with a first reference voltage; a second comparator that compares the power supply voltage with a second reference voltage; a logic gate that outputs a signal indicating whether the power supply voltage exceeds a range from the first reference voltage to the second reference voltage using a comparison result of the first comparator and that of the second comparator; and a counter that counts outputs of this logic gate. According to the invention disclosed in Japanese Utility Model Registration No. 3096469, however, a direct-current (DC) level change of the power supply itself is also handled as a noise. Further, the invention disclosed in Japanese Utility Model Registration No. 3096469 is intended to measure a noise outside of the LSI. The device, therefore, fails to include a portion designed so that the portion is mounted in the LSI.

SUMMARY OF THE INVENTION

It is, therefore, an object of the present invention to provide a power supply noise measuring device capable of accurately measuring an amount of high-frequency power supply noise on a chip (on the LSI), acquiring a peak noise that suddenly occurs, and facilitating fetching an output of the device as a low-speed signal.

According to the present invention, there is provided a power supply noise measuring device comprising: a high pass filter that inputs a power supply signal from a power supply line, and that outputs a signal obtained by removing components having frequencies equal to or lower than a predetermined frequency from the input power supply signal; a first adder that generates a signal by adding a first direct-current signal to the signal output from the high pass signal; a comparator that compares a voltage of the signal output from the first adder with a reference voltage; a counter that performs a counting operation controlled according to a comparison result of the comparator, and that is reset in a predetermined cycle; and a sample hold circuit that sample-holds a count value of the counter just before the counter is reset.

The above-stated power supply noise measuring device according to the first aspect of the invention may further comprise: a digital/analog converter that generates a signal having an identification voltage corresponding to identification voltage indication data; and a second adder that generates a signal having the reference voltage by adding the first direct-current signal to the signal having the identification voltage.

The above-stated power supply noise measuring device may further comprise a digital/analog converter that generates a signal having the reference voltage according to reference voltage indication data.

The above-stated power supply noise measuring device may further comprise a sampling clock signal generator that generates a sampling clock signal having a frequency corresponding to sampling clock frequency indication data, and the comparator and the counter may operate synchronously with the sampling clock signal.

The above-stated power supply noise measuring device may further comprise a frequency divider circuit that divides the frequency of the sampling clock signal, and that generates a signal having the predetermined frequency, the counter may be reset by the signal having the predetermined frequency, and the sample hold circuit may sample the count value by the signal having the predetermined frequency.

The above-stated power supply noise measuring may further comprise: a frequency divider circuit that divides a frequency of a system clock signal, and that generates a signal having the predetermined frequency, the counter may be reset by the signal having the predetermined frequency, and the sample hold circuit may sample the count value by the signal having the predetermined frequency.

In the above-stated power supply noise measuring device, the counter may be allowed to perform the counting operation or inhibited from performing the counting operation according to a comparison result of the comparator.

In the above-stated power supply noise measuring device, the counter may perform a count-up operation or a count-down operation according to a comparison result of the comparator.

The above-stated power supply noise measuring device may further comprise a power supply signal generation circuit that outputs a stabilized power supply signal, and the adder may use the stabilized power supply signal.

The above-stated power supply noise measuring device may further comprise a power supply signal generation circuit that outputs a stabilized power supply signal, and the first adder, the digital/analog converter, and the second adder may use the stabilized power supply signal.

The above-stated power supply noise measuring device may further comprise a power supply signal generation circuit that outputs a stabilized power supply signal, and the first adder and the digital/analog converter may use the stabilized power supply signal.

The above-stated power supply noise measuring device may further comprise a power supply signal generation circuit that outputs a stabilized power supply signal, and the sampling clock signal generator circuit may use the stabilized power supply signal.

The above-stated power supply noise measuring device may further comprise a power supply signal generation circuit that outputs a stabilized power supply signal, and the first direct-current signal may be generated by dividing a voltage of the stabilized power supply signal within the first adder.

The above-stated power supply noise measuring device may further comprise: a power supply signal generation circuit that outputs the stabilized power supply signal; and a direct-current signal generation circuit that generates the first direct-current signal by dividing a voltage of the stabilized power supply signal.

In the above-stated power supply noise measuring device, the power supply signal generation circuit may input the power supply signal, to which a noise signal has been added, from the power supply line, and may remove at least components having frequencies equal to or higher than the predetermined frequency, in the noise signal, thereby obtaining the stabilized power supply signal.

Since the noise measuring device according to the present invention includes the high pass filter, no error is added to the voltage of the noise to be measured due to a DC variation in the power supply signal. The voltage of the noise can be, therefore, evaluated with high accuracy.

Further, since the noise measuring device according to the present invention includes the first adder, the input voltage of the comparator falls within an appropriate range even if a operating range of the comparator is equal to or higher than zero volt.

Moreover, since the noise measuring device according to the present invention includes the counter and the sample hold circuit, the device can measure a frequency with which the voltage of the noise is equal to or higher than the reference voltages, and read the measurement result even at a low-speed.

BRIEF DESCRIPTION OF THE DRAWINGS

FIG. 3 is a diagram that depicts a configuration of an LSI on which a power supply noise measuring device according to one embodiment of the present invention is mounted;

FIG. 4 is a block diagram that depicts a configuration of a power supply noise measuring device according to a first embodiment of the present invention;

DESCRIPTION OF THE PREFERRED EMBODIMENTS

Figure 1:
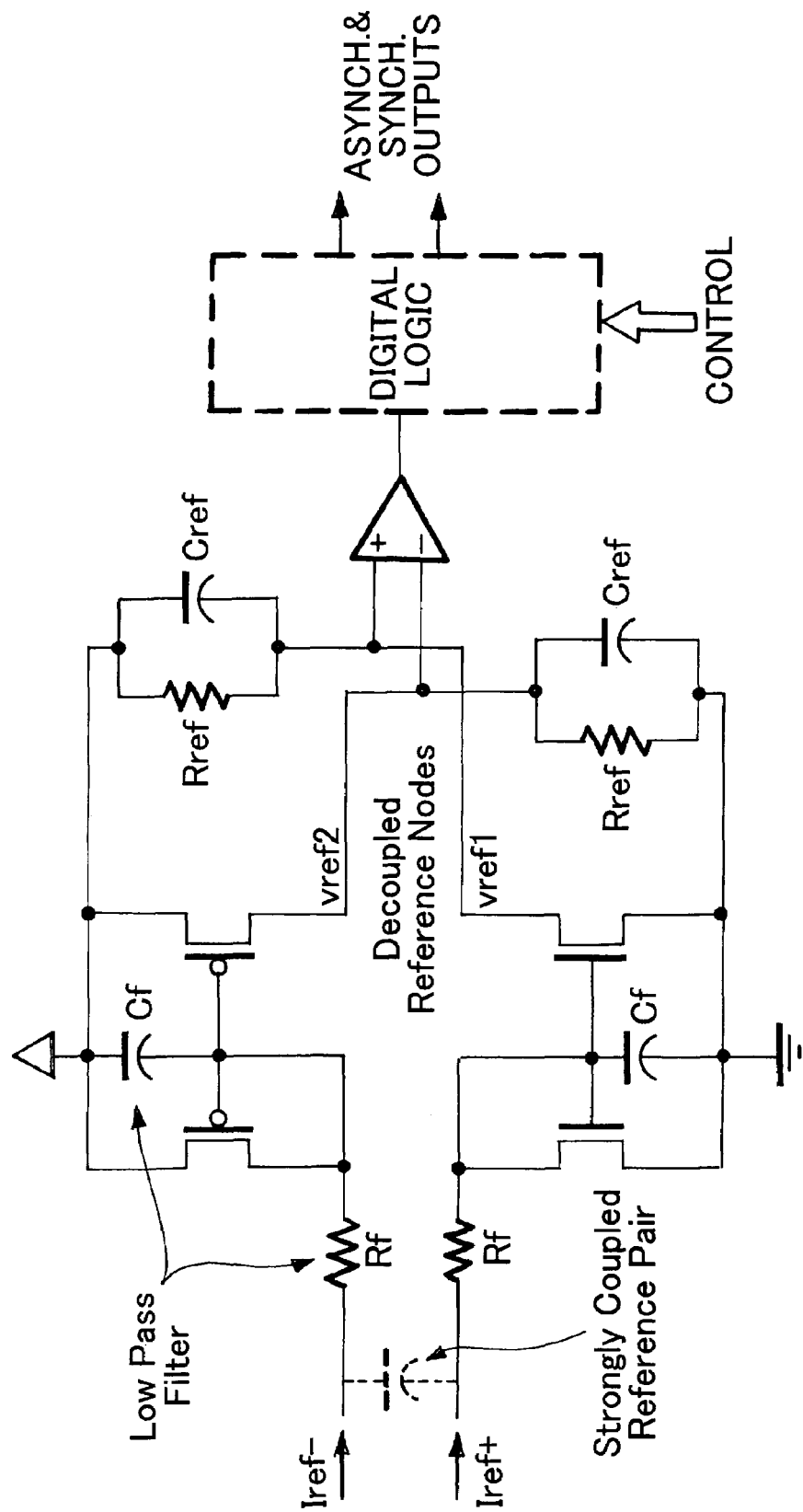
FIG. 1 is a circuit diagram that depicts a configuration of a power supply noise measuring device according to a first related art.
Figure 2:
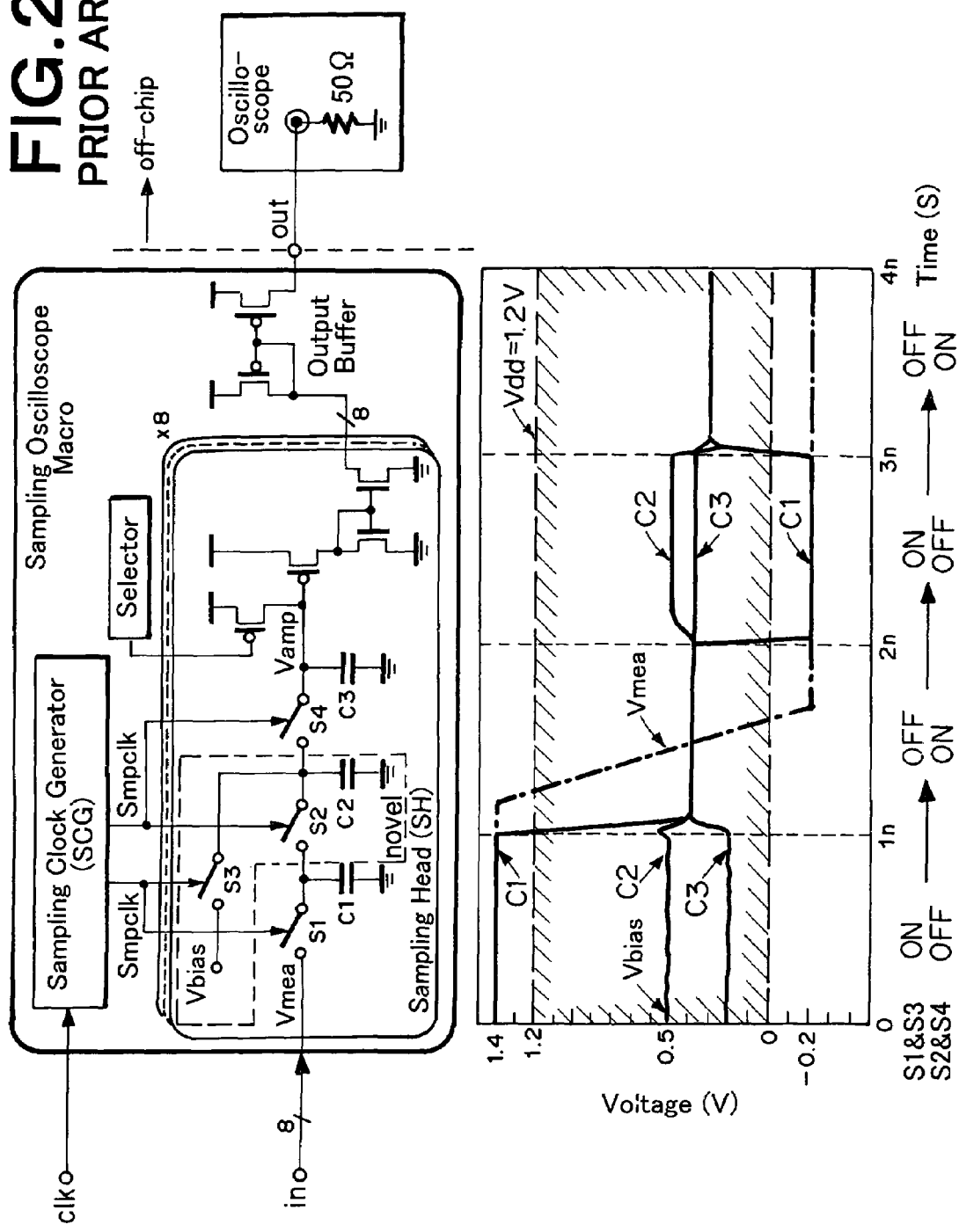
FIG. 2 is a circuit diagram that depicts a configuration of a power supply noise measuring device according to a second related art.

The present invention is characterized by probing a high-frequency noise including a single peak noise within an LSI (on-chip), and outputting information on a noise amount to an outside of the LSI using a low-speed signal.

Most preferred embodiments of the present invention will be described hereinafter in detail with reference to the accompanying drawings.

FIG. 3 is a layout view of an LSI in which power supply noise measuring devices according to the present invention are mounted. Referring to FIG. 3, the LSI includes a plurality of macros (e.g., macros A, B, C, and D). Each macro is provided with a power supply and uses a power generated by the power supply. The power supply noise measuring device according to the present invention is mounted on each macro and measures a noise signal superimposed on a power supply signal generated by the power supply of each macro.

First Embodiment

FIG. 4 is a block diagram that depicts a configuration of a power supply noise measuring device according to a first embodiment of the present invention.

Referring to FIG. 4, the power supply noise measuring device according to the first embodiment includes a low pass filter (hereinafter, "LPF") 101, a voltage divider circuit 102, a high pass filter (hereinafter, "HPF") 103, a first adder 104, a first digital/analog (D/A) converter 105, a comparator 106, a counter 107, a sample hold circuit 108, a clock transfer circuit 109, a sampling clock generator 110, a frequency divider circuit 111, and a waveform shaper 112. The sampling clock generator 110 includes a second D/A converter 110-1 and a voltage controlled oscillator (hereinafter, "VOC") 110-2.

The LPF 101 inputs a signal from a power supply line. The input signal includes a noise signal as well as a power supply signal. A level of this noise signal is a measuring target. The LPF 101 causes only components having frequencies equal to or lower than a cutoff frequency $f_{C, LPF}$ of the LPF 101 in the input signal to pass through the LPF 101, and outputs the components. By setting the cutoff frequency $f_{C, LPF}$ equal to or lower than a cutoff frequency $f_{C, HPF}$ of the HPF 103, the components having the frequencies equal to or higher than the cutoff frequency $f_{C, LPF}$ in the noise signal can be measured.

The LPF 101 generates a voltage far smaller in change than the power supply voltage on the power supply line. The LPF 101 functionally corresponds, therefore, to a power supply signal generation circuit that generates a stabilized power supply signal. The LPF 101 may be replaced by, for example, a DC—DC converter or a regulator. Further, a signal from an external terminal may be used as the stabilized power supply signal.

The HPF 103, the first adder 104, the first D/A converter 105, the comparator 106, the second D/A converter 110-1, and the VCO 110-2 use the stabilized power supply signal.

The voltage divider circuit 102 divides a voltage of the stabilized power supply signal from the LPF 101 at a predetermined ratio (e.g., a ratio of one to one or a ratio of two to one), and outputs a divided-voltage signal lower in voltage than the stabilized power supply signal (for example, 50% or 66% lower than the signal output from the LPF 101).

The HPF 103 inputs the signal from the power supply line, causes only components having frequencies equal to or higher than the cutoff frequency $f_{C, HPF}$ in the input signal to pass through the HPF 103, and outputs the components. For example, if a frequency of a system clock of a macro is 1 GHz, the cutoff frequency $f_{C, HPF}$ is set at 100 MHz. The signal output from the HPF 103 includes, therefore, only components having frequencies equal to or higher than the cutoff frequency $f_{C, HPF}$ among those of the noise signal. The output signal of the HPF 103 varies at a voltage around a zero volt, accordingly.

Figure 5A:
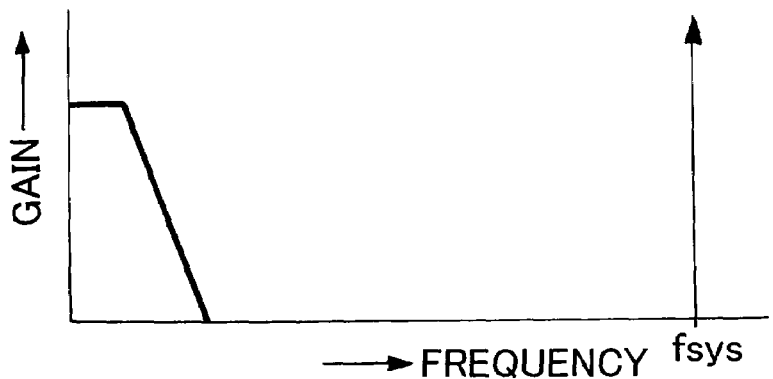
FIGS. 5A and 5B are graphs that depict frequency characteristics of a low-pass filter and a high-pass filter shown in FIG. 4, respectively.
Figure 5B:
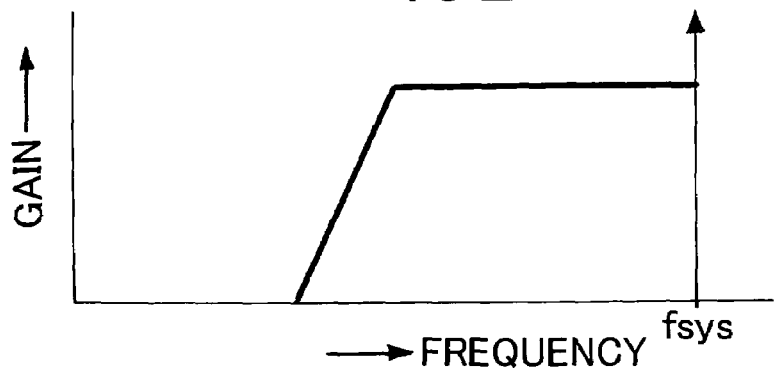

A relationship between the system clock frequency and a passband of the LPF 101 is shown in FIG. 5A, and a relationship between the system clock frequency and a passband of the HPF 103 s shown in FIG. 5B. The LPF 101 and the HPF 103 may be primary filters. Alternatively, they may be higher-order filters than the primary filters.

The first adder 104 adds the divided-voltage signal from the voltage divider circuit 102 to the signal output from the HPF 103. The comparator 106 uses only the stabilized power supply signal Vo as the power supply signal, and does not use a negative power supply signal. A voltage range of the signal input to the comparator 106 is, therefore, limited to at least a range from zero volt to the voltage of the stabilized power supply signal. On the other hand, the signal output from the HPF 103 varies at the voltage around zero volt as stated. Therefore, by providing the first adder 104, the voltage range of the input signal of the comparator 106 is set to meet the limitation.

The first D/A converter 105 outputs a reference signal having a reference voltage indicated by reference voltage indication data. For example, if the voltage of the divided-voltage signal is $V_{OFFSET}$ and the noise is to be identified based on a voltage $V_{NTH}$, the reference voltage is set at $V_{OFFSET}+V_{NTH}$. The first D/A converter 105 may be composed by, for example, a ladder resistor.

The second D/A converter 110-1 and the VCO 110-2 output a sampling clock signal having a frequency indicated by sampling clock frequency indication data and a frequency control signal having a controlled voltage based on sampling clock frequency data, respectively.

The VCO 110-2 outputs the sampling clock signal having a frequency corresponding to the controlled voltage of the frequency control signal. The VCO 110-2 may be configured so that a gain and an offset thereof can be adjusted and so that the VCO 110-2 can be indicated to adjust them through an external pin.

If the sampling clock signal is fed back and an error in the sampling clock frequency thereof is found to occur, the sampling clock frequency indication data may be corrected.

If the system clock frequency is 1 GHz, the sampling clock frequency may be set at, for example, 10 GHz or other.

The frequency divider circuit 111 divides the frequency of the system clock signal at a frequency division ratio designated by frequency division ratio indication data.

Figure 6:
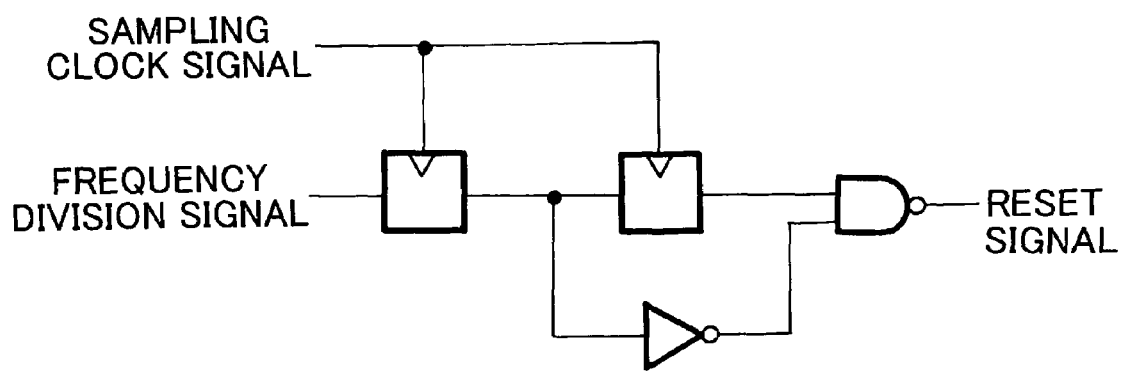
FIG. 6 is a circuit diagram that depicts an exemplary configuration of a waveform shaper shown in FIG. 4.
Figure 7:
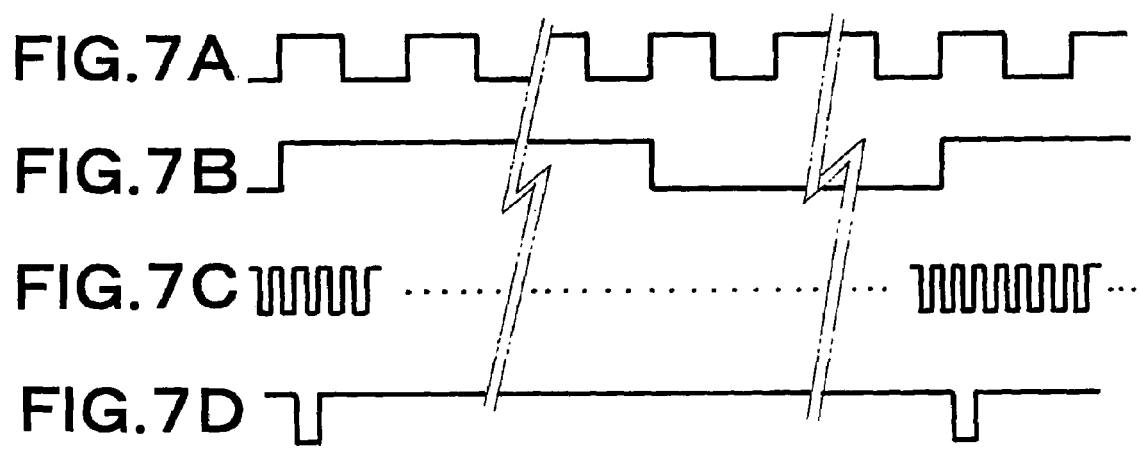
FIGS. 7A to 7D are timing charts that depict operations performed by the waveform shaper configured as shown in FIG. 5.

The waveform shaper 112 shapes a waveform of a frequency-divided signal output from the frequency divider circuit 111, and generates a frequency-divided signal rising detection signal synchronized with the sampling clock signal as a reset signal. An exemplary configuration of the waveform shaper 112 is shown in FIG. 6 and timing charts thereof are shown in FIGS. 7A to 7D. FIG. 7A depicts the system clock signal, FIG. 7B depicts the frequency-divided signal, FIG. 7C depicts the sampling clock signal, and FIG. 7D depicts the reset signal.

Figure 8:
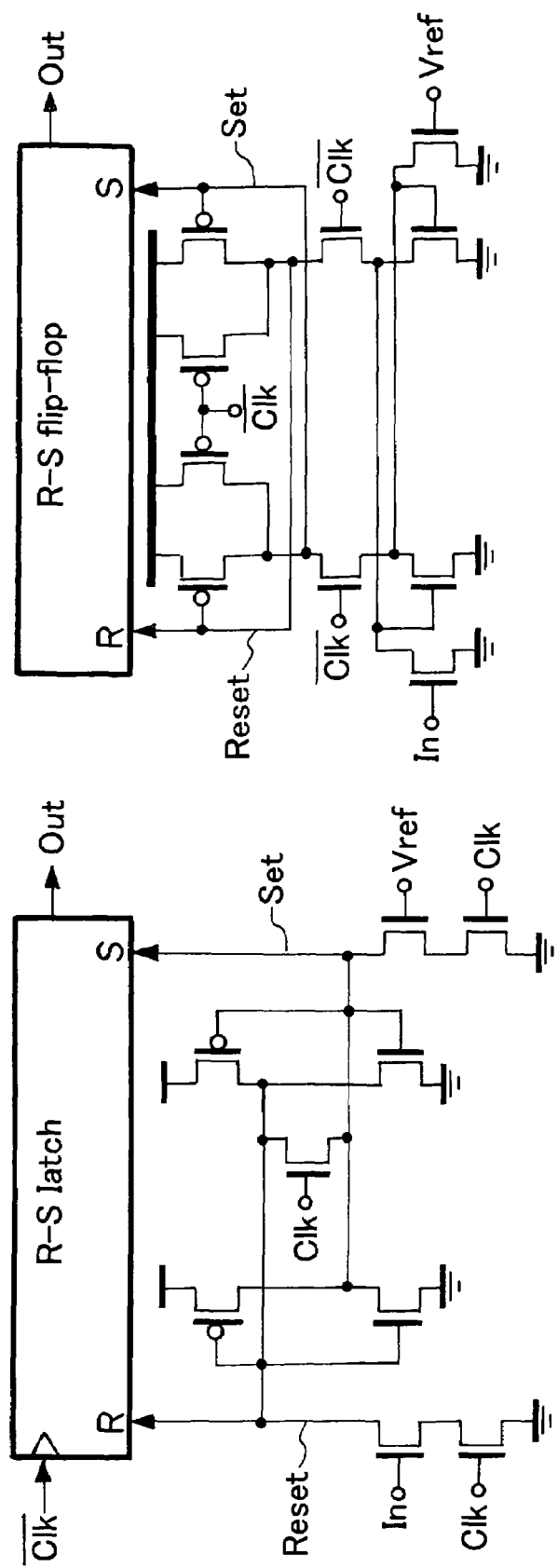
FIG. 8 is a circuit diagram that depicts an exemplary configuration of a comparator shown in FIG. 4.

The comparator 106 compares a voltage of an addition signal of the first adder 104 (which signal is obtained by adding the voltage-divided signal to the noise signal output from the HPF 103) with the reference voltage of the reference signal output from the first D/A converter 105. The comparator 106 outputs a HIGH-level comparison result signal if the former voltage is higher than the latter, and outputs a LOW-level comparison result signal if the former is lower than the latter. The comparator 106 needs to convey a correct comparison result to the counter 107. For this reason, the comparator 106 operates synchronously with the sampling clock similarly to the counter 107. FIG. 8 depicts two exemplary configurations of the comparator 106.

The counter 107 may be either an Up counter or an Up/Down counter.

If the counter 107 is the Up counter and the comparison result signal output from the comparator 106 is the HIGH-level signal, the counter 107 performs a count-up operation synchronously with the system clock signal. If the counter 107 is the Up counter and the comparison result signal output from the comparator 106 is the LOW-level signal, the counter 107 stops a counting operation. The counter 107 is cyclically reset by the reset signal. For this reason, a count value of the counter 107 just before the counter 107 is reset is proportional to a period in which the voltage of the addition signal obtained by adding the voltage-divided signal to the noise signal is equal to or higher than the voltage of the reference signal within a period corresponding to a reset cycle. As described, if the voltage of the reference signal is $V_{OFFSET}+V_{TH}$ obtained by adding an identification voltage $V_{TH}$ to the voltage $V_{OFFSET}$ of the voltage-divided signal, the count value of the counter 107 just before the counter 107 is reset is proportional to the period in which the voltage of the noise signal is equal to the identification signal $V_{TH}$ within the period corresponding to the reset cycle.

If the counter 107 is the Up/Down counter and the comparison result signal output from the comparator 106 is the HIGH-level signal, the counter 107 performs the count-up operation synchronously with the system clock signal. If the counter 107 is the Up/Down counter and the comparison result signal output from the comparator 106 is the LOW-level signal, the counter 107 performs a count-down operation. The counter 107 is cyclically reset by the reset signal. For this reason, the count value of the counter 107 just before the counter 107 is reset is proportional to a time obtained by subtracting a period, in which the voltage of the addition signal obtained by adding the voltage-divided signal to the noise signal is lower than the reference voltage of the reference signal, from the period in which the voltage of the addition signal obtained by adding the voltage-divided signal to the noise signal is equal to or higher than the reference voltage of the reference signal within the period corresponding to the reset cycle. As stated, if the voltage of the reference signal is $V_{OFFSET}+V_{TH}$ obtained by adding the identification voltage $V_{TH}$ to the voltage $V_{OFFSET}$ of the voltage-divided signal, the count value of the counter 107 just before the counter 107 is reset is proportional to the time obtained by subtracting a period in which the voltage of the noise signal is lower than the identification signal $V_{TH}$ from the period in which the voltage of the noise signal is equal to the identification signal $V_{TH}$ within the period corresponding to the reset cycle.

The sample hold circuit 108 operates synchronously with the sampling clock signal and uses the reset signal as a clock enable signal. The sample hold circuit 108, therefore, sample-holds the count value of the counter 107 just before the counter 107 is reset. Data (count value data) output from the sample hold circuit 108 is updated in the reset cycle, accordingly.

The clock transfer circuit 109 converts the count value data synchronized with the sampling clock signal into count value data synchronized with the system clock signal. As the clock transfer circuit 109, a circuit described in, for example, Japanese Patent Application Laid-Open No. 2001-144735 can be used. It is noted, however, that any circuit can be used as the clock transfer circuit 108 as long as the circuit samples the count value data output from the sample hold circuit 108 synchronously with the system clock signal at a timing at which the clock value data is stable. The timing at which the clock value data is stable is, for example, a timing shifted in phase from the reset signal by about 180 degrees, and such timing can be generated by, for example, the frequency divider circuit 111. By inserting the clock transfer circuit 109, the count value data can be used by a circuit (e.g., a count value analysis circuit) operating synchronously with the system clock signal.

Figure 9A:
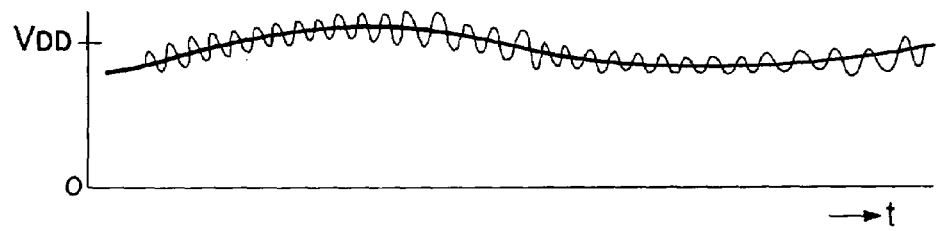
FIGS. 9A to 9H are timing chart that depict waveforms of signals corresponding to principal parts of the power supply noise measuring device according to the first embodiment of the present invention.
Figure 9B:
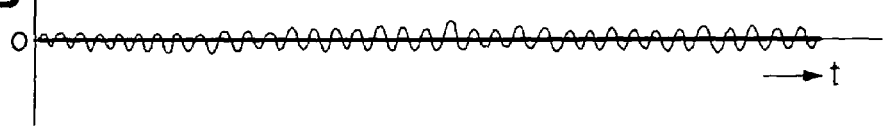
Figure 9C:
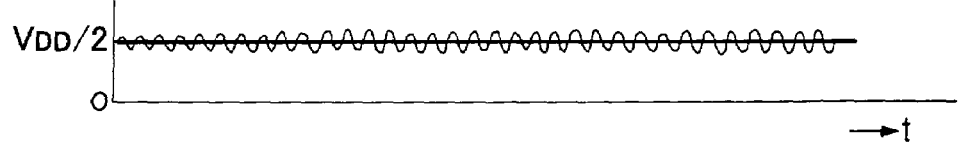
Figure 9D:
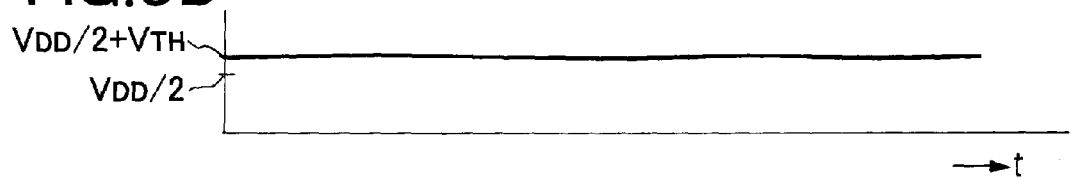
Figure 9E:
Figure 9F:
Figure 9G:
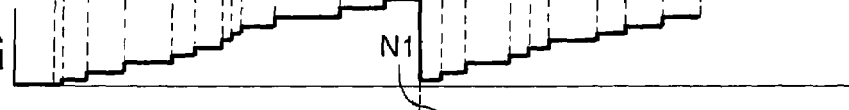
Figure 9H:

FIGS. 9A to 9H are timing charts of principal signals handled by the noise measuring device, respectively. FIG. 9A depicts a signal obtained by adding the noise signal to the power supply signal on the power supply line. FIG. 9A exaggeratedly shows a DC variation in the power supply signal. FIG. 9B depicts the signal output from the HPF 103. The power supply signal (including DC variation components having frequencies equal to or lower than the cutoff frequency) is removed from this output signal, and the cutoff frequency is equal to or higher than a variation frequency of the power supply signal. The signal shown in FIG. 9B includes only the components having the frequencies equal to or higher than the cutoff frequency among those in the noise signal. In addition, this signal varies at the voltage around zero volt. FIG. 9C depicts the signal output from the first adder 104. This signal varies according to the noise signal at the voltage around the voltage (e.g., VDD/2) of the voltage-divided signal. FIG. 9D depicts the signal output from the first D/A converter 105. This signal is obtained by adding the identification voltage $V_{TH}$ to the voltage (e.g., VDD/2) of the voltage-divided signal. FIG. 9E depicts the signal output from the comparator 106. FIG. 9F depicts the reset signal. FIG. 9G depicts the count value output from the counter 107. FIG. 9H depicts the count value data output from the sample hold circuit 108.

Figure 10:
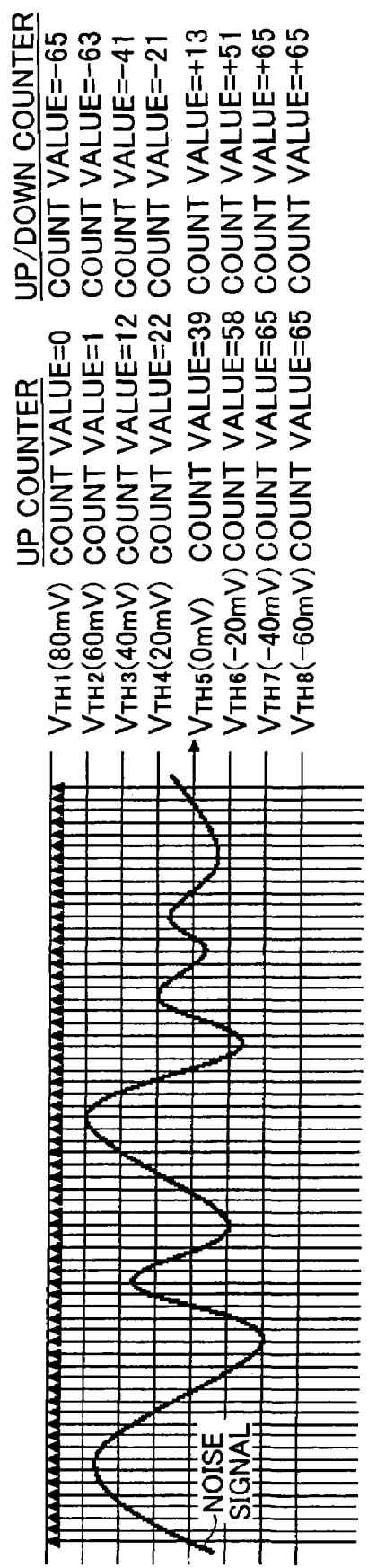
FIG. 10 is a graph showing dependency of a count value output from the power supply noise measuring device on an identification voltage according to the first embodiment of the present invention.

FIG. 10 shows that the count value is changed when the identification voltage $V_{TH}$ is changed. Accordingly, by changing the reference voltage indication data, count value data corresponding to a plurality of identification voltages $V_{TH}$ can be obtained, thus a voltage distribution of the noise signal as one shown in FIG. 11 can be known.

Figure 11A:
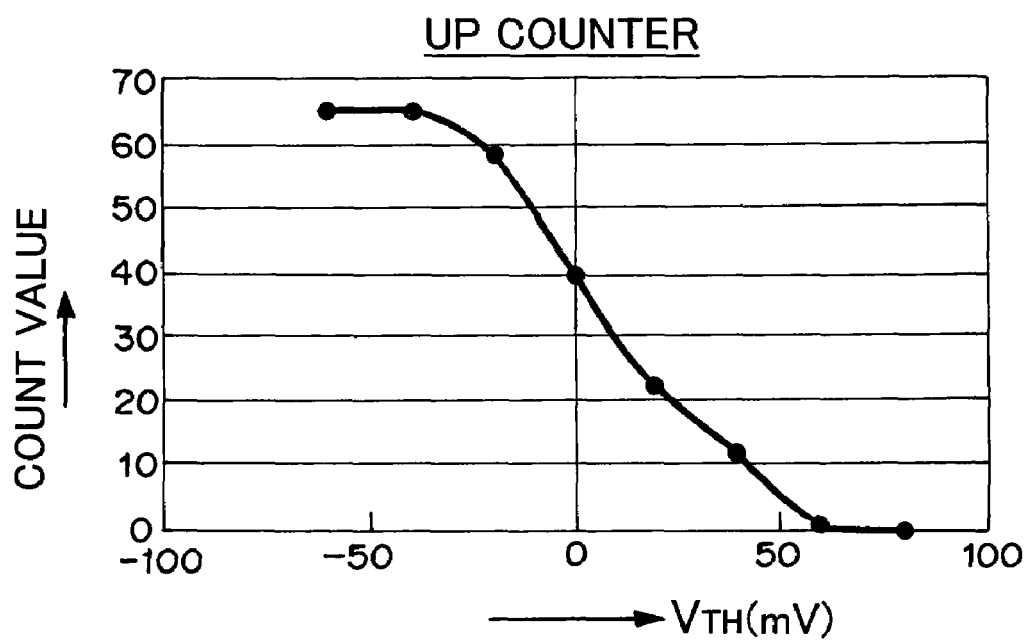
FIGS. 11A and 11B are graphs each showing a relationship between the count value output from the power supply noise measuring device and an identification voltage according to the first embodiment of the present invention.
Figure 11B:
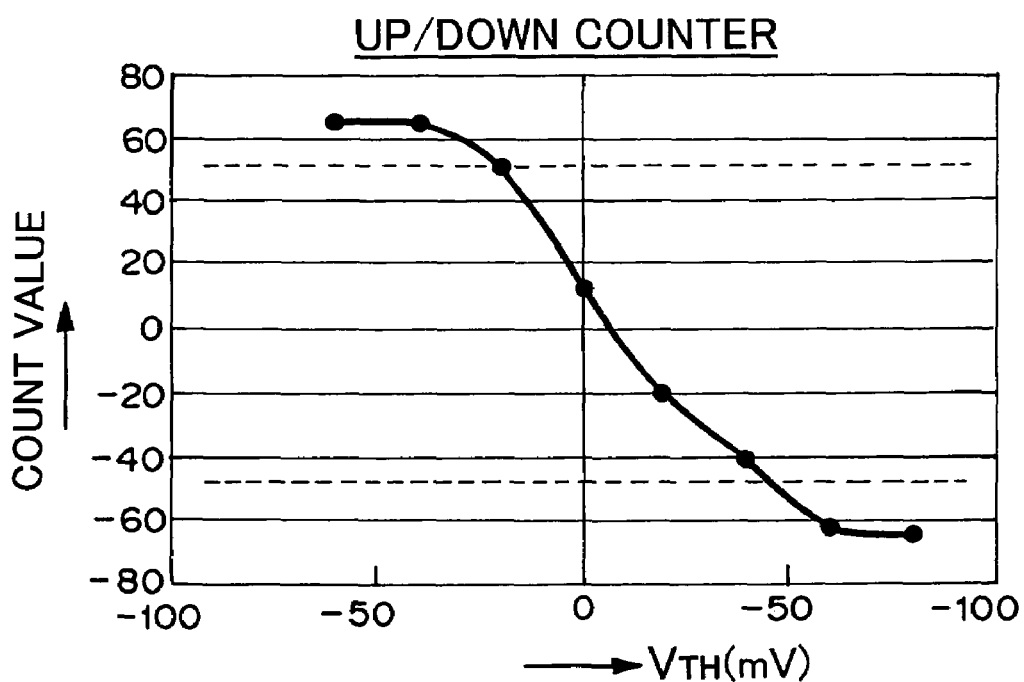

More specifically, it is assumed that a power supply noise having a voltage of −40 mV and a power supply noise having a voltage of +60 mV occur. Since a size of each macro is 100 um to 200 um square, circuits operating at the sampling clock having the frequency of 10 GHz or higher can be created. FIG. 10 depicts an example of operating the circuits at the sampling clock having the frequency of 10 GHz. The counter 107 starts counting results of the comparison of the identification voltage with the power supply noise, at a time at which the reset signal is input in a time axis direction. First, when the identification voltage is changed, the count value is changed as shown in FIG. 10. The count value differs depending on whether the counter 107 is the Up counter or the Up/Down counter. FIGS. 11A and 11B show changes of the count values of the Up counter and the Up/Down counter, respectively. As shown in FIGS. 11A and 11B, points at which the count value has no change correspond to a maximum amplitude of a negative power supply noise voltage and a maximum amplitude of a positive power supply noise voltage, respectively. If designed allowable noise voltages are ±40 mV, the noise voltage exceeds the allowable noise voltage by about 20 mV since the count value is changed at a voltage of +60 mV. If the voltages of ±40 mV are critical values for the circuit, the identification voltage may be fixed to the values. By doing so, maintenance of the field-shipping LSI can be conducted using the count value or the LSI can be subjected to a screening test at the time of shipping. Further, information on a noise distribution within the LSI can be acquired by scanning the identification voltage, detecting the positive-side and the negative-side maximum values at points at which the count value has no change, storing the count value in a random access memory (RAM) of the device, and arranging a plurality of noise measuring devices in the LSI.

Second Embodiment

Figure 12A:
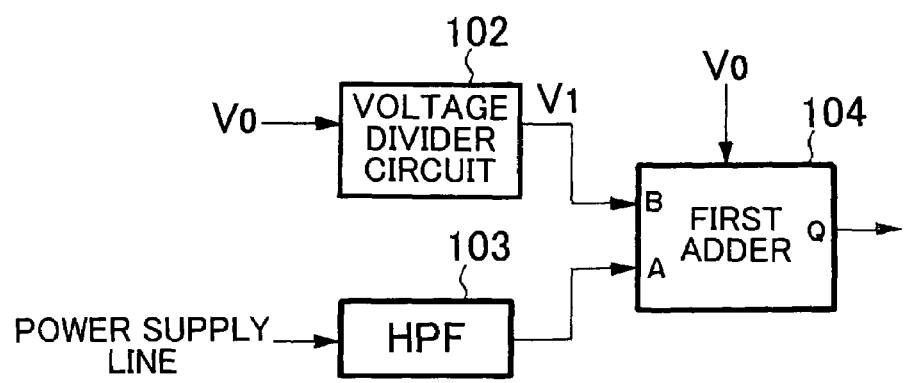
FIG. 12A is a circuit diagram that depicts exemplary configurations of a voltage divider circuit, a high pass filter, and an adder according to the first embodiment.

FIG. 12A is a circuit diagram that depicts the voltage divider circuit 102, the HPF 103, and the first adder 104 extracted from the power supply noise measuring device according to the first embodiment. According to a second embodiment of the present invention, these constituent elements are realized by a circuit shown in FIG. 12B. In the circuit shown in FIG. 12B, the voltage divider circuit 102, the HPF 103, and the first adder 104 are formed integrally with one another.

The voltage divider circuit 102 is composed by transistors 211, 212, and 213. The HPF 103 is composed by transistors 201, 211, 212, and 213, and a capacitor 202. The first adder 104 is composed by the transistors 201, 211, 212, and 213 and the capacitor 202. As can be seen, the internal configuration of the first adder 104 is such that a DC signal at a voltage V1 is obtained by dividing a stabilized power supply signal at a voltage V0.

The transistor 214 functions as a stabilized capacity.

Third Embodiment

In the first embodiment, the frequency divider circuit 111 divides the frequency of the system clock signal based on the frequency division ratio indication data. The first embodiment has an advantage in that even if the frequency of the sampling clock signal is changed, an update cycle of the count value data can be determined only based on the frequency division ratio indication data. However, the frequency of the sampling clock signal and that of the frequency-divided signal are set independently of each other. For this reason, to grasp the ratio of the period in which the voltage of the noise signal exceeds the identification voltage, it is necessary to obtain information on the frequency of the sampling signal and that of the frequency-divided signal as well as the count value data. In addition, to grasp the frequency of the frequency-divided signal, it is necessary to obtain information on the frequency of the system clock signal and the frequency division ratio indication data.

In a third embodiment of the present invention, the frequency divider circuit 111 divides the frequency of the sampling clock signal based on the frequency division ratio indication data. If so, the maximum count value can be obtained only from the frequency division ratio indication data, and the ratio of the period in which the voltage of the noise signal exceeds the identification voltage only can be obtained from this maximum count value and the count value data.

Fourth Embodiment

In the first embodiment, the reference voltage indication data is set so that the voltage of the reference signal output from the first D/A converter 105 is equal to the voltage obtained by adding the identification voltage $V_{NTH}$ to the voltage $V_{OFFSET}$ of the divided-voltage signal.

If so, an offset between the voltage $V_{OFFSET}$ of the voltage-divided signal and the voltage of the reference signal is not easily adjusted. Namely, the voltage of the voltage-divided signal often differs from a design value due to a manufacturing error that occurs to the voltage divider circuit 102 and former stages of circuits of the voltage divider circuit 102. In addition, the voltage of the reference signal often differs from a design value due to a manufacturing error that occurs to the first D/A converter 105. Accordingly, two offset variation factors are present.

Further, if the voltage of the voltage-divided signal is changed by a crosstalk or the like, an error occurs to the comparison result of the comparator 106.

The fourth embodiment is intended to solve the two disadvantages. A configuration of a power supply noise measuring device according to the fourth embodiment is shown in FIG. 13.

Figure 13:
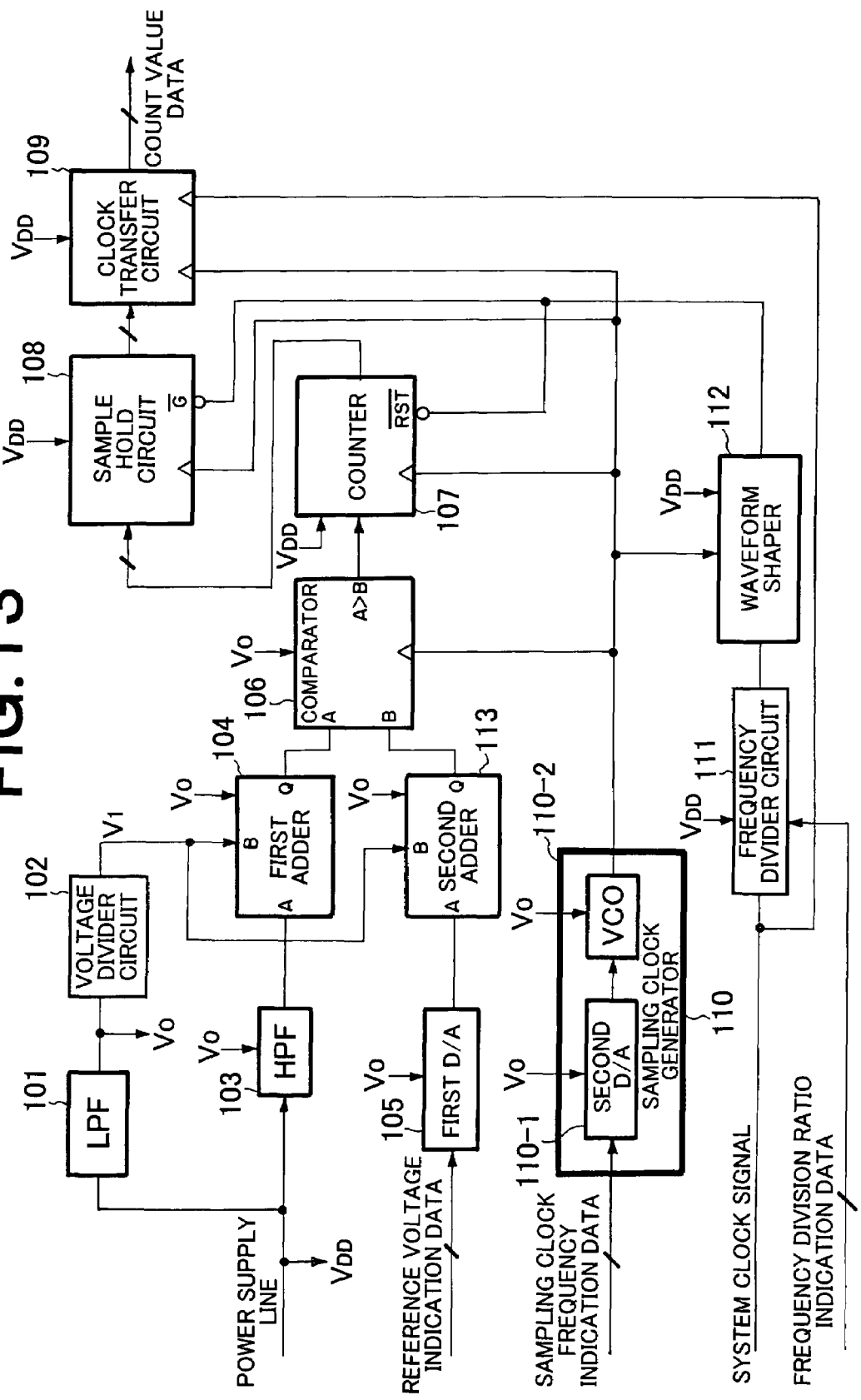
FIG. 13 is a block diagram that depicts a configuration of a power supply noise measuring device according to a fourth embodiment of the present invention.

As is obvious from comparison of FIG. 4 with FIG. 13, the power supply noise measuring device according to the fourth embodiment differs from that according to the first embodiment in that a second adder 113 is interposed between the first D/A converter 105 and the comparator 106. The first D/A converter 105 inputs identification voltage indication data and outputs a signal (an identification voltage signal) having an identification voltage corresponding to the identification voltage indication data.

The second adder 113 adds the identification voltage signal output from the first D/A converter 105 to the voltage-divided signal output from the voltage divider circuit 102, and outputs a signal (a reference voltage signal) obtained by the addition and having a reference voltage to the comparator 106.

The comparator 106, therefore, compares the voltage of the signal obtained by adding the voltage-divided signal to the components having frequencies equal to or higher than the cutoff frequency in the noise signal with the voltage of the signal obtained by adding the voltage-divided signal to the identification voltage signal. Accordingly, the comparator 106 substantially compares the voltage having the frequency equal to or higher than the cutoff frequency of the noise signal with the voltage (identification voltage) of the identification voltage signal. This comparison result is not, therefore, influenced by the variation in the voltage-divided signal.

Further, if the first D/A converter 105 is configured so that the converter 105 never fails to output the identification voltage signal at the voltage of zero volt when the identification voltage indication data indicates zero volt, the offset error of the identification voltage signal can be eliminated.

Fifth Embodiment

The first D/A converter 105 according to the fourth embodiment needs a negative power supply signal generated either outside or inside of the LSI. According to a fifth embodiment of the present invention, by contrast, a first D/A converter 105 does not need a negative power supply signal.

Figure 14A:
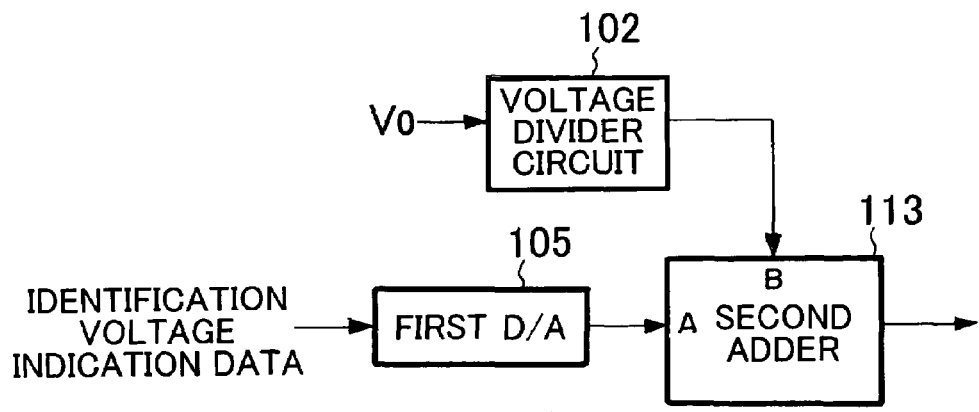
FIG. 14A is a circuit diagram that depicts exemplary configurations of a voltage divider circuit, a first digital/analog converter circuit, and a second adder according to the fourth embodiment.

FIG. 14A is a circuit diagram that depicts the voltage divider circuit 102, the first D/A converter 105, and the second adder 113 extracted from the power supply noise measuring device according to the fourth embodiment. According to the fifth embodiment, these constituent elements are realized by a circuit shown in FIG. 14B. In the circuit shown in FIG. 14B, the voltage divider circuit 102, the first D/A converter 115, and the second adder 113 are formed integrally with one another.

The voltage divider circuit 102 is composed by resistors 254-1 to 254-N. The first D/A converter 105 is composed by the resistors 254-1 to 254-N and a selector circuit 155. The second adder 113 is composed by transistors 251, 252, and 253, and the resistors 254-1 to 254-N.

A potential of a coupling point at which the transistors 252 is coupled to the transistor 253 is (⅓)×VO. The resistors 254-1 to 254-N are all equal in resistance and the number of resistors N is an even number. Accordingly, a potential of a coupling point at which the (N/2)th resistor is coupled to the (N/2)+1th resistor is (⅔)×VO. Accordingly, the selector circuit 255 is designed so as to select this coupling point when the identification voltage indication data indicates zero volt.

The transistor 256 functions as a stabilized capacity.

Figure 12B:
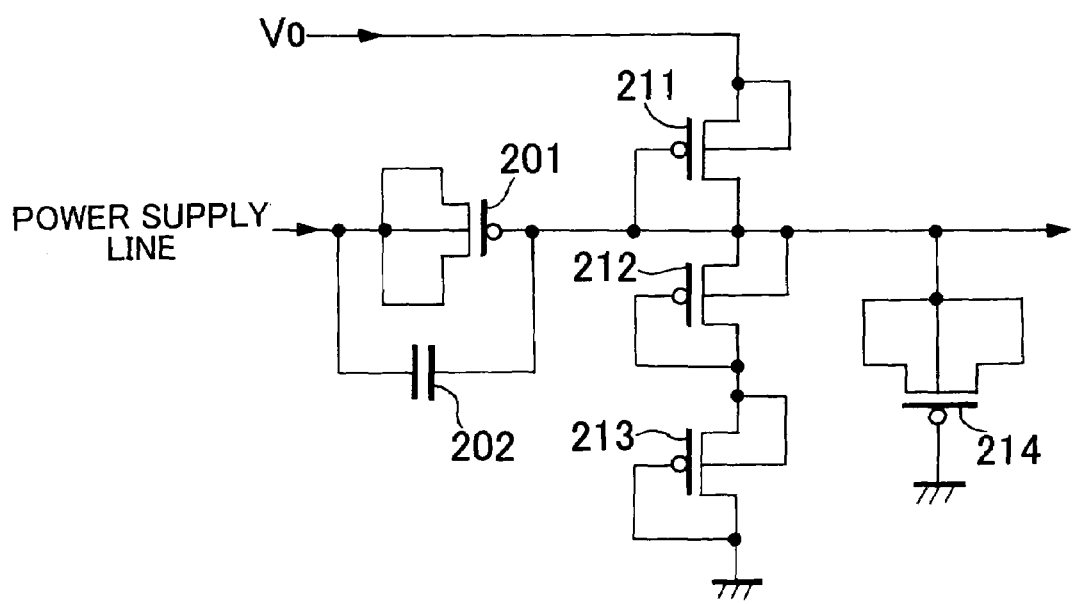
FIG. 12B is a circuit diagram that depicts exemplary configurations of a voltage divider circuit, a high pass filter, and an adder according to a second embodiment of the present invention.
Figure 14B:
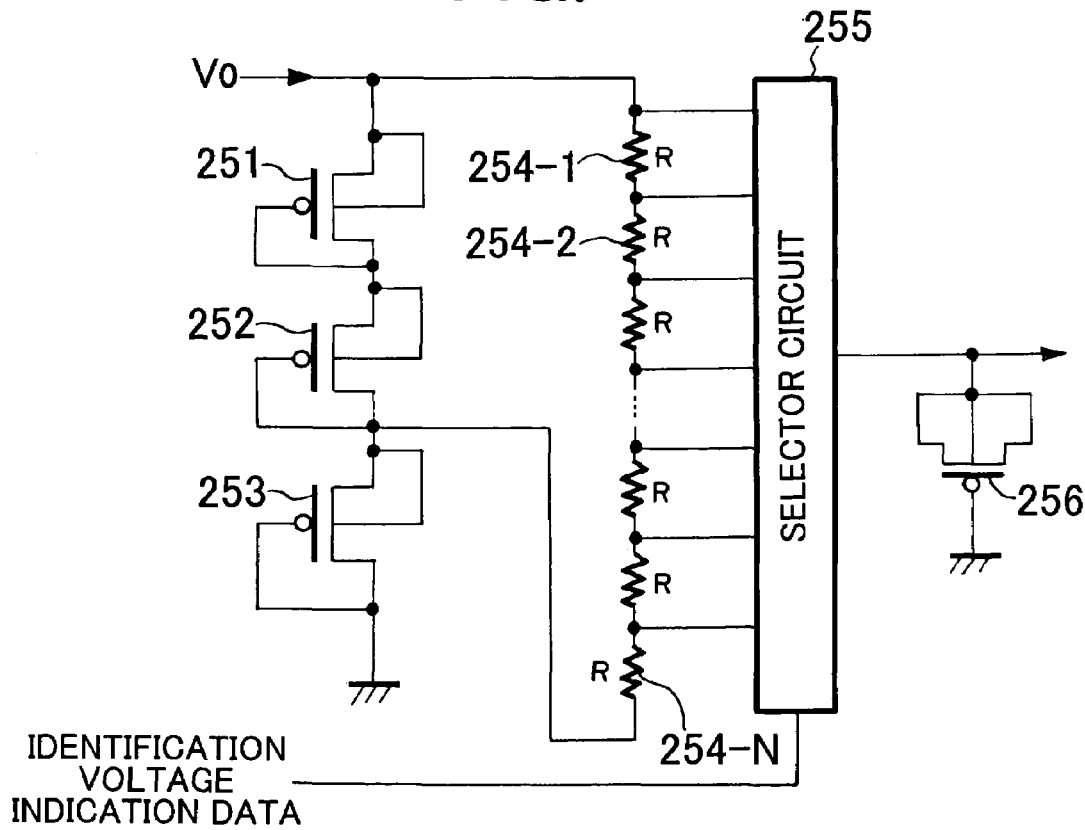
FIG. 14B is a circuit diagram that depicts exemplary configurations of a voltage divider circuit, a first digital/analog converter circuit and a second adder according to a fifth embodiment of the present invention.

By using the circuit shown in FIG. 12B and the circuit shown in FIG. 14B, a voltage of a signal output from the coupling point between the transistors 211 and 212 and a voltage of a signal output from the selector circuit 255 when the identification voltage indication data indicates zero volt vary at an equal amplitude in an equal direction even if the voltage VO of the output signal of the LPS 101 is changed. For example, when the voltage of the output signal of the LPF 101 is VO+ΔVO, the voltage of the signal output from the coupling point between the transistors 211 and 212 and the voltage of the signal output from the selector circuit 255 when the identification voltage indication data indicates zero volt are both (⅔)×(VO+ΔVO). It is, therefore, possible to prevent an error from occurring in the comparison result of the comparator by the variation in the voltage VO of the output signal output from the LPF 101.

To make the resistances of the resistors 254-1 to 254-N uniform, it is necessary to make directions, sizes (widths, lengths, and thicknesses), and components of polysilicons that constitute the respective resistors uniform. In addition, it is preferable to arrange dummy polysilicons around the polysilicons that constitute the respective resistors 254-1 to 254-N so as to make the components of the polysilicons thereof more uniform.

Sixth Embodiment

A RAM may be provided in the LSI, and a plurality of sets of reference voltage indication data (or identification voltage indication data), sampling clock frequency indication data, frequency division ratio indication data, and count value data may be stored in this RAM. For example, whenever the reference voltage indication data (or identification voltage indication data), the sampling clock frequency indication data, or the frequency division ratio indication data is changed, these sets of data are stored in the RAM. Circuit, wirings, pins, and the like are provided so that a device or the like outside of the LSI can collectively read these sets of data from the outside of the LSI.

According to the present invention, the power supply noise within the LSI that operates at quite a high-speed can be probed, and even the peak noise that suddenly occurs can be observed. Further, since observation information can be fetched as an ordinary-level signal, macros can be arranged with a high flexibility without any particular restrictions. Accordingly, the macros can be arranged to be close to a power supply to be observed, and data can be fed back to a design with high efficiency. Further, by arranging a plurality of power supply noise measuring devices at the respective locations, the noise distribution within the LSI can be recognized, and measures (e.g., an increase of an on-chip capacity) against the noise can be taken locally. Besides, by using the noise measuring device in the maintenance or the screening test, the noise amount within the LSI can be observed even in a remote state, and a replacement operation can be performed on the element having a critical value.

The present invention is applicable to measurement of the power supply noise within the LSI. The present invention is, therefore, applicable to measurement of a power supply noise that occurs to the interior of the LSI and that has a high frequency.

What is claimed is:

1. A power supply noise measuring device comprising:
   a high pass filter that inputs a power supply signal from a power supply line, and that outputs a signal obtained by removing components having frequencies equal to or lower than a predetermined frequency from the input power supply signal;
   a first adder that generates a signal by adding a first direct-current signal to the signal output from the high pass filter;
   a comparator that compares a voltage of the signal output from the first adder with a reference voltage;
   a counter that performs a counting operation controlled according to a comparison result of the comparator, and that is reset in a predetermined cycle; and
   a sample hold circuit that sample-holds a count value of the counter just before the counter is reset.

2. The power supply noise measuring device according to claim 1, further comprising:
   a digital/analog converter that generates a signal having an identification voltage corresponding to identification voltage indication data; and
   a second adder that generates a signal having the reference voltage by adding the first direct-current signal to the signal having the identification voltage.

3. The power supply noise measuring device according to claim 1, further comprising:
   a digital/analog converter that generates a signal having the reference voltage according to reference voltage indication data.

4. The power supply noise measuring device according to claim 1, further comprising:
   a sampling clock signal generator that generates a sampling clock signal having a frequency corresponding to sampling clock frequency indication data, wherein
   the comparator and the counter operate synchronously with the sampling clock signal.

5. The power supply noise measuring device according to claim 4, further comprising:
   a frequency divider circuit that divides the frequency of the sampling clock signal, and that generates a signal having the predetermined frequency, wherein
   the counter is reset by the signal having the predetermined frequency, and
   the sample hold circuit samples the count value by the signal having the predetermined frequency.

6. The power supply noise measuring device according to claim 4, further comprising:
   a frequency divider circuit that divides a frequency of a system clock signal, and that generates a signal having the predetermined frequency, wherein the counter is reset by the signal having the predetermined frequency, and the sample hold circuit samples the count value by the signal having the predetermined frequency.

7. The power supply noise measuring device according to claim 1, wherein the counter is permitted to perform the counting operation or inhibited from performing the counting operation according to a comparison result of the comparator.

8. The power supply noise measuring device according to claim 1, wherein the counter performs a count-up operation or a count-down operation according to a comparison result of the comparator.

9. The power supply noise measuring device according to claim 1, further comprising:

a power supply signal generation circuit that outputs a stabilized power supply signal, wherein the first adder uses the stabilized power supply signal.

10. The power supply noise measuring device according to claim 2, further comprising:

a power supply signal generation circuit that outputs a stabilized power supply signal, wherein the first adder, the digital/analog converter, and the second adder use the stabilized power supply signal.

11. The power supply noise measuring device according to claim 3, further comprising:

a power supply signal generation circuit that outputs a stabilized power supply signal, wherein the first adder and the digital/analog converter use the stabilized power supply signal.

12. The power supply noise measuring device according to claim 4, further comprising:

a power supply signal generation circuit that outputs a stabilized power supply signal, wherein the sampling clock signal generator circuit uses the stabilized power supply signal.

13. The power supply noise measuring device according to claim 1, further comprising:

a power supply signal generation circuit that outputs a stabilized power supply signal, wherein the first direct-current signal is generated by dividing a voltage of the stabilized power supply signal within the first adder.

14. The power supply noise measuring device according to claim 4, further comprising:

a power supply signal generation circuit that outputs a stabilized power supply signal, wherein the first direct-current signal is generated by dividing a voltage of the stabilized power supply signal within the first adder.

15. The power supply noise measuring device according to claim 2, further comprising:

a power supply signal generation circuit that outputs the stabilized power supply signal; and a direct-current signal generation circuit that generates the first direct-current signal by dividing a voltage of the stabilized power supply signal.

16. The power supply noise measuring device according to any one of claims 9 to 15, wherein the power supply signal generation circuit inputs the power supply signal, to which a noise signal has been added, from the power supply line, and removes at least components having frequencies equal to or higher than the predetermined frequency, in the noise signal, thereby obtaining the stabilized power supply signal.

17. A power supply noise measuring method comprising the steps of:

causing a high pass filter to input a power supply signal from a power supply line, and to output a signal obtained by removing components having frequencies equal to or lower than a predetermined frequency from the input power supply signal;

causing a first adder to generate a signal by adding a first direct-current signal to the signal output from the high pass filter;

causing a comparator to compare a voltage of the signal output from the first adder with a reference voltage;

causing a counter to perform a counting operation controlled according to a comparison result of the comparator, and to be reset in a predetermined cycle; and causing a sample hold circuit to sample-hold a count value of the counter just before the counter is reset.

18. The power supply noise measuring method according to claim 17, further comprising the steps of:

causing a digital/analog converter to generate a signal having an identification voltage corresponding to identification voltage indication data; and causing a second adder to generate a signal having the reference voltage by adding the first direct-current signal to the signal having the identification voltage.

19. The power supply noise measuring method according to claim 17, further comprising the step of:

causing a digital/analog converter to generate a signal having the reference voltage according to reference voltage indication data.

20. The power supply noise measuring method according to claim 17, further comprising the steps of:

causing a sampling clock signal generator to generate a sampling clock signal having a frequency corresponding to sampling clock frequency indication data; and causing the comparator and the counter to operate synchronously with the sampling clock signal.

21. The power supply noise measuring method according to claim 20, further comprising the steps of:

causing a frequency divider circuit that divides the frequency of the sampling clock signal, and to generate a signal having the predetermined frequency;

causing the counter to be reset by the signal having the predetermined frequency, and causing the sample hold circuit to sample the count value by the signal having the predetermined frequency.

22. The power supply noise measuring method according to claim 20, further comprising the steps of:

causing a frequency divider circuit to divide a frequency of a system clock signal, and to generate a signal having the predetermined frequency;

causing the counter to be reset by the signal having the predetermined frequency, and causing the sample hold circuit to sample the count value by the signal having the predetermined frequency.

23. The power supply noise measuring method according to claim 17, further comprising the step of:

causing the counter to be permitted to perform the counting operation or inhibited from performing the counting operation according to a comparison result of the comparator.

24. The power supply noise measuring method according to claim 17, further comprising the step of:

causing the counter to perform a count-up operation or a count-down operation according to a comparison result of the comparator.

25. The power supply noise measuring method according to claim 17, further comprising the steps of:
   causing a power supply signal generation circuit to output a stabilized power supply signal; and
   causing the first adder to use the stabilized power supply signal.

26. The power supply noise measuring method according to claim 18, further comprising the steps of:
   causing a power supply signal generation circuit to output a stabilized power supply signal; and
   causing the first adder, the digital/analog converter, and the second adder to use the stabilized power supply signal.

27. The power supply noise measuring method according to claim 19, further comprising the steps of:
   causing a power supply signal generation circuit to output a stabilized power supply signal; and
   causing the first adder and the digital/analog converter to use the stabilized power supply signal.

28. The power supply noise measuring method according to claim 20, further comprising the steps of:
   causing a power supply signal generation circuit to output a stabilized power supply signal; and
   causing the sampling clock signal generator circuit to use the stabilized power supply signal.

29. The power supply noise measuring method according to claim 17, further comprising the steps of:
   causing a power supply signal generation circuit to output a stabilized power supply signal; and
   causing the first direct-current signal to be generated by dividing a voltage of the stabilized power supply signal within the first adder.

30. The power supply noise measuring method according to claim 20, further comprising the steps of:
   causing a power supply signal generation circuit to output a stabilized power supply signal; and
   causing the first direct-current signal to be generated by dividing a voltage of the stabilized power supply signal within the first adder.

31. The power supply noise measuring method according to claim 18, further comprising the steps of:
   causing a power supply signal generation circuit to output the stabilized power supply signal; and
   causing a direct-current signal generation circuit to generate the first direct-current signal by dividing a voltage of the stabilized power supply signal.

32. The power supply noise measuring method according to any one of claims 25 to 31, further comprising the step of:
   causing the power supply signal generation circuit to input the power supply signal, to which a noise signal has been added, from the power supply line, and to remove at least components having frequencies equal to or higher than the predetermined frequency, in the noise signal, thereby obtaining the stabilized power supply signal.

* * * * *